United States Patent [19]
Cappelletti

[11] Patent Number: 6,074,916
[45] Date of Patent: Jun. 13, 2000

[54] FLASH-EPROM WITH EMBEDDED EEPROM

[75] Inventor: Paolo Cappelletti, Seveso, Italy

[73] Assignee: SGS-Thomson Microelectronics S.r.l., Agrate Brianza, Italy

[21] Appl. No.: 09/164,761

[22] Filed: Oct. 1, 1998

Related U.S. Application Data

[62] Division of application No. 08/833,925, Apr. 10, 1997, Pat. No. 5,850,092.

[30] Foreign Application Priority Data

Apr. 15, 1996 [EP] European Pat. Off. ............. 96830212

[51] Int. Cl.[7] ............................................. H01L 21/8247
[52] U.S. Cl. ........................................ 438/258; 438/264
[58] Field of Search ..................................... 438/257–267

[56] References Cited

U.S. PATENT DOCUMENTS

| | | |
|---|---|---|
| 4,780,431 | 10/1988 | Maggioni et al. . |
| 5,057,886 | 10/1991 | Riemenschneider et al. ......... 357/23.5 |
| 5,597,748 | 1/1997 | Asano et al. . |
| 5,910,016 | 6/1999 | Kazerounian et al. ................ 438/258 |
| 5,960,274 | 9/1999 | Mehta ..................................... 438/211 |

FOREIGN PATENT DOCUMENTS

| | | |
|---|---|---|
| 0422606 A3 | 4/1991 | European Pat. Off. . |
| 0486444 A3 | 5/1992 | European Pat. Off. . |
| 0487468 A3 | 5/1992 | European Pat. Off. . |
| 0704851 A1 | 4/1996 | European Pat. Off. . |

OTHER PUBLICATIONS

Takebuchi Masataka, Patent Abstracts of Japan, "Semiconductor Memory Device," vol. 18, No. 53 (Oct. 22, 1993).

Samachisa et al., *IEEE International Solid–State Circuits Conference*, "A 128K Flash EEPROM Using Double Polysilicon Technology," pp. 76–77 and 345 (Feb. 25, 1987).

*Primary Examiner*—Richard Booth
*Attorney, Agent, or Firm*—Theodore E. Galanthay; Allen, Dyer, Doppelt, Milbrath & Gilchrist, P.A.

[57] ABSTRACT

Cost-efficient integration of a fully-featured EEPROM memory block in a FLASH-EPROM memory device, fabricated according to a low supply voltage and low power consumption FLASH-EPROM process, is made possible by a special structure of the EEPROM cells whereby the capacitive coupling between the floating gate and the control gate of the cell is realized over the field oxide adjacent to the active area of the cell. The process of the invention permits an optimized modulation of the thicknesses of the different tunnel and gate oxides of the FLASH-EPROM and EEPROM cells, as well as of the transistors of the peripheral circuitry of the two memory blocks destined to work with a relatively low supply voltage or with a boosted voltage.

23 Claims, 5 Drawing Sheets

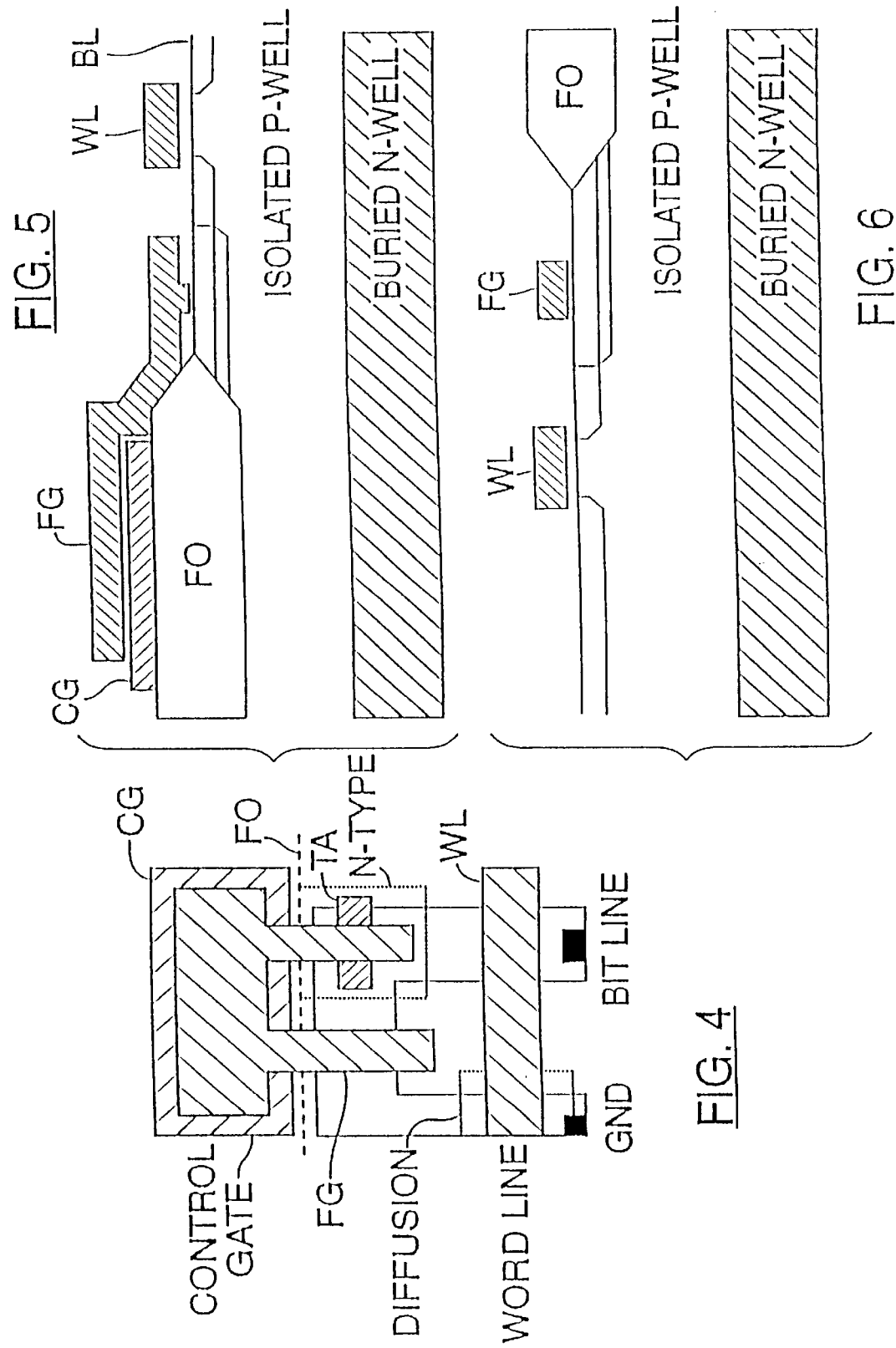

FLASH-EPROM WITH EMBEDDED EEPROM

This application is a division of Ser. No. 08/833,925 filed on Apr. 10, 1997, now U.S. Pat. No. 5,850,092, the disclosure of which is hereby incorporated by reference in its entirety.

FIELD OF THE INVENTION

The present invention relates to memories that include a FLASH-EPROM (sector erasable) memory and an EEPROM (byte-erasable) memory on a single chip.

BACKGROUND OF THE INVENTION

The development of nonvolatile memories based on the principle of trapping electrical charge in an isolated or floating gate of a field effect transistor (cell) in order to modify its turn-on threshold, has had and continues to have an extremely important role in the achievement of ever increasing levels of compactness, speed and low power consumption of integrated circuit systems. The development of such memories is closely tied to a parallel development of suitable fabrication technologies and to the physical mechanisms that can be practically exploited for injecting electrical charges in a floating gate through an isolating dielectric, which often also constitutes the gate dielectric of the cell (field effect transistor), as in the case of FLASH-EPROM cells.

The requisite of altering the content of the memory by single bytes (herein intended to constitute a unit of information composed of a certain number of bits, for example 8, 16, 32 etc.) without having to reprogram the entire memory as in the case of the so-called EPROM memories, and therefore the requisite of erasing certain selected cells while leaving unchanged the information content of other cells, has led to develop the so called EEPROM or E$^2$PROM cells (both being acronyms for Electrically Erasable and Programmable Read Only Memory). Typically, the problem associated with the necessity of biasing the floating gate (through its capacitive coupling with a control gate) and the semiconducting substrate to charge the floating gate and eventually discharge the electrical charge stored therein, has been satisfied by realizing a capacitive coupling zone between the floating gate and the drain region of the semiconducting substrate through a thin tunnelling oxide.

Through such a tunnelling window, the flow of electrons from the isolated gate to the drain region of the substrate and vice-versa, during an erasing and a programming phase, occurs by the so-called Fowler-Nordheim tunnelling mechanism by applying a sufficiently high voltage of one sign for erasing and of the opposite sign for the programming of the cell. Unfortunately, bytewise erasability of EPROM memories is achieved with a penalty in terms of compactness. Overall the cells are from three to four times larger for the same fabrication technology, than an EPROM cell because they require the integration of a select transistor associated with each cell.

The improvement of fabrication technologies has allowed a further reduction of the thickness of the isolation dielectric between the floating gate and the monocrystalline silicon substrate while reliably ensuring a remarkable absence of defects. This has permitted the development of the so-called FLASH-EPROM cells or memories. The FLASH cell is programmable through a mechanism of injection of hot channel electrons into the floating gate. This is achieved by biasing the control gate with a sufficiently high positive voltage and the drain of the cell with an intermediate voltage, to produce in the channel zone of the monocrystalline silicon substrate of the cell a strong electric field to generate a current of highly energetic (HOT) electrons within the silicon. The number of HOT electrons will be capable of overcoming the potential barrier at the interface with the dielectric, and be thereafter attracted toward the floating gate by the electric field.

Due to the extreme thinness of the gate dielectric layer, the erasure may be accomplished by applying a relatively high voltage to the source region while maintaining the other electrodes ground potential. Under these conditions, the electrons that had been injected into the floating gate are able to cross the thin dielectric according to a Fowler-Nordheim tunnelling mechanism, thus discharging a previously programmed floating gate.

Upon completing the memory erasure, the individual FLASH cells assume a threshold of a value that is not uniform and constant for all the cells but is normally contained within a certain variation range. In other words, there exists a spread of the threshold values among erased cells. The erasure does not take place by single bytes but rather for the entire memory block or, as often implemented, by sectors or more or less large sub-blocks.

Notwithstanding the relatively low cost, high speed and compactness of FLASH memories, there are some applications which also need, in addition to the FLASH, also a fully featured EEPROM memory block (typically of much lower capacity) in which to store data that need to be frequently altered (updated). These requisites generally occur in systems wherein only a small portion of the data stored in a permanent (nonvolatile) manner is to be frequently updated, while a vast mass of data is destined to remain unvaried in time or to be modified only at special occasions and generally after relatively long intervals of time, for example, to update the system completely to changed functioning or environmental conditions.

Alternative solutions are known offering a pseudo EEPROM performance, though substantially realizing a FLASH memory, by exploiting software methods based on momentarily shifting the data on a different media, correcting or updating them and rewriting them in the previously erased FLASH memory. These systems are relatively burdensome in terms of the time that is demanded on the system's microprocessor.

Other solutions are based upon a peculiar architecture of FLASH-EPROM arrays, such as to make them erasable by blocks. A system of this type is disclosed in the U.S. Pat. No. 5,289,423. Other proposed solutions penalize the compactness of a FLASH-EPROM memory block by also realizing a select transistor associated with each cell, for making the threshold voltage of all the cells uniform as the erasure of the memory array is performed. This technique is described in the paper entitled "A 128K FLASH-EPROM using Double Polysilicon Technology" by George Samachisa, Chien-Sheng Su, Yu-Sheng Kao, George Smarandoiu, Ting Wong, Chenming Hu, presented at the IEEE International Solid-State Circuits Conference of Feb. 25, 1987.

A further technique of this type is described in the European Patent Application No. 94830459.7 filed on Sep. 27, 1994. According to this approach, the objective is to make available some typical functions of an EEPROM cell by modifying the basic architecture of a FLASH-EPROM memory cell. By way of these structural changes of the FLASH memory, functions are obtained that are proper of an EEPROM memory (basically byte erasability and programming) with a fabrication process of FLASH memories.

An evermore accentuated development of battery powered portable devices requiring integrated systems that may be powered with extremely low voltages and having a reduced consumption, has made more severe the problems of integration compatibility of different structures. These must be optimized in terms of tolerating low supply voltages and of reducing power consumption.

FLASH memories, still unsurpassed in terms of compactness, require, during the programming phase, relatively high voltages and above all they absorb large currents. On the other hand, in single voltage supply devices the programming voltage is internally generated by charge pump circuits whose limited ability of delivering currents of non-negligible level imposes severe scaling limitations for supply voltage below approximately 2.5V.

On the other hand, the problem of containing possible energy consumption is more difficult during the reading than during programming. Indeed, in many applications, including those relative to cellular telephones, FLASH memories are reprogrammed only occasionally while conversely they are read "in continuation". Under these conditions, the target of reducing consumption may be interpreted as a target of reducing the supply voltage during the reading phase.

The requisite of assuring the highest performances with the least possible consumption, that is to say using the lowest possible supply voltage, imposes an optimization of the CMOS fabrication process and of the integrated circuit design to ensure reliable performance during reading phases with very low supply voltage and with a consequent limitation on the tolerable variation interval of the supply voltage.

According to state of the art technology, a FLASH memory specifically optimized for low consumption applications, is defined by a dual supply device, utilizing a programming voltage of approximately 2.7V to 3.6V and a reading voltage significantly lower, commonly in the range of 1.7V to 2.5V. On the other hand, as already mentioned, in many applications the capability of integrating onto the same device containing the FLASH memory a memory array (typically of reduced capacity) of EEPROM cells is desirable, that is, an EEPROM memory having unconditionally all the characteristics and peculiarities of EEPROM cells.

Though requiring a larger silicon area, EEPROM cells also require for their programming an energy that is orders of magnitude lower than that needed by high density FLASH-EPROM cells. In other words, EEPROM cells even though requiring programming voltages relatively high, absorb currents relatively much lower than those required by high density FLASH-EPROM cells. Therefore, the high programming voltage can be more easily generated internally to the integrated device with acceptable yields by means of dedicated charge pump circuits even if starting from a relatively low supply voltage. An integrated circuit containing a high density FLASH memory and a fully featured EEPROM memory, normally functioning with a voltage from approximately 1.7 to 2.5V during reading phases of both the types of memory, as well as during programming phases of the EEPROM cells, and with a supply voltage from 2.7V to 3.6V for the programming of the high density FLASH memory, represents, according to present technology, a nearly optimal condition for applications in portable instrumentation such as cellular telephones.

The structure of a FLASH high density memory cell is that of a single transistor having a gate structure including double polysilicon levels as shown in FIG. 1. The cell may be programmed either through injection of hot channel electrons or by means of the Fowler-Nordheim tunnelling mechanism and is erased through a Fowler-Nordheim tunnelling mechanism. In all cases the programming efficiency is rather low because only a small portion of the current absorbed during the writing phase is exploited for charging or discharging the floating gate while the majority of it is sinked toward the substrate or the cell's source, as shown in FIG. 2.

An EEPROM cell has a more complex structure, including three elements: a double gate transistor, a tunnelling window defined by a thin area of tunnelling oxide realized in an overlap region of the same floating gate over an N-type diffusion, and a select transistor. The cell is written and erased through the Fowler-Nordheim and it is important to observe that, differently from the FLASH cell, practically the entire amount of absorbed current during the writing phase of the cell is exploited for charging the floating gate.

Despite the fact that both types of cells may have an overlapped multilevel gate structure, realized with two polysilicon levels, as well as the fact that both utilize a relatively thin tunnelling dielectric layer (tunnel oxide), it is quite difficult, that is, extremely expensive to integrate both on the same chip because of the different thickness that are required for the two tunnelling dielectric layers (tunnel oxide). The tunnelling dielectric of a FLASH-EPROM cell has a thickness commonly within 9 and 12 nm, grown over a substantially undoped silicon (that is to say on a channel region of the semiconductor of a two gate transistor). In contrast, the tunnelling dielectric layer of an EEPROM cell has commonly a thickness of 7 to 9 nm, grown over an N-type doped silicon region. As well known to those skilled in the art, the rate of growth of an oxide layer is definitely higher over an N-type doped region of the silicon semiconductor substrate than over an undoped or significantly less doped region of the same substrate.

From this stems the difficulty or impracticality of simultaneously growing both the oxides. It should be considered that, according to state of the art technologies, the growing of a certain gate dielectric layer (or tunnel dielectric layer) must be immediately followed by the deposition of a relative polysilicon layer of capacitive coupling through the dielectric just formed.

In most recent fabrication processes of high density FLASH memory devices, based on the programming mechanism via hot channel electron injection or via a dual Fowler-Noroheim tunnelling (for programming and erasing), a special CMOS structure referred to as "triple well" structure as shown in FIG. 3, is used so to allow the integration of either P-MOS transistors or N-MOS transistors isolated from the p-substrate. This facilitates the generation and switching of the negative voltages required during the writing phase (programming) of the FLASH memory cells. In these processes use is made of two different gate oxide layers for the peripheral transistors: a relatively thick layer, usually of about 15–25 nm, is used for peripheral transistors of the decoding circuits subject to high programming voltages, whereas a thinner gate layer is used for the other peripheral transistors destined to function at lower supply voltages.

The thickness of the gate oxide of these "low voltage" transistors, scaled in relation with the actual design reading voltage, is usually within about 15 and 18 nm for "5V devices" and is generally within about 10 and 12 nm for "3V devices". In the case of a reading supply voltage between 1.7V and 2.5V the optimal thickness of the gate oxide of peripheral low voltage transistors may be estimated to be between 5 and 7 nm approximately.

SUMMARY OF THE INVENTION

The disclosed invention provides for a way of overcoming the above mentioned and well known difficulties of integrating EEPROM cells in a high density FLASH-EPROM device designed for low voltage and low consumption according to one of the state of the art fabrication processes used for this type of FLASH-EPROM devices.

According to this invention, this target is achieved by implementing a particular EEPROM cell structure such that it is compatibly integrable through a high density FLASH-EPROM fabrication process for low voltage and low consumption without requiring demanding modifications of the fabrication process, and, thus, without increasing significantly the fabrication cost of such a device comprising also an EEPROM memory with all the intrinsic characteristics of this type of byte-erasable and byte-programmable memory including a high programming efficiency, that is to say a reduced power consumption.

According to a first aspect of the invention the integrated circuit, comprising at least a first array of floating gate FLASH-EPROM memory cells and at least a second array of floating gate EEPROM memory cells, is characterized by a structure that basically uses four different dielectric layers for capacitive coupling with the semiconductor regions, each of these layers having a different thickness.

In accordance with another aspect of the invention, it is possible by starting from a normal fabrication process for high density FLASH devices, to produce a proper integrated structure by only one additional masking step, required to define an N-diffusion beneath the tunnelling window and only one additional implantation step through this mask of a proper dopant (arsenic and/or phosphorus) in a dose ranging between 0.5 and $1*10^{15}$ atoms/cm$^2$.

According to a preferred embodiment, these operations can be carried out after having normally grown a field oxide defining the active areas, implanted and diffused the n-well diffusions and, according to a particularly preferred embodiment, also implanted and diffused deep n-well regions and implanted and diffused therein isolated p-well regions, according to an architecture known as "triple well". This will be disclosed in more detail below. These operations can be carried out finally after completing the routine implant operation of threshold correction (LSV-Nch, LSV-Pch) of the n-channel regions and of the p-channel regions, according to a normal fabrication process of these low voltage FLASH-EPROM devices.

Consistent with this embodiment, after having completed these additional masking and implantation steps in the tunnelling zone, a first growing of tunnel oxide is undertaken in the active areas of the FLASH-EPROM cells up to an effective thickness commonly between 9 and 12 nm. The growing of this first oxide layer may be freely optimized to obtain the most appropriate thickness for the functioning of the FLASH cells. The growing of a tunnel oxide layer in the active areas of the FLASH-EPROM cells is followed by the deposition and doping of a polysilicon layer of the first level and its definition along a first direction (that is along in parallel strips) to define along a first direction (perpendicular to wordlines) the floating gate structures of the FLASH-EPROM cells and, according to another essential aspect of the invention, also the control gate structures of the EEPROM cells over the field oxide adjacent to the respective active area of the cells.

Thereafter, the steps for forming an interpoly isolating dielectric layer are carried out, preferably in accordance with a known technique that contemplates the deposition of a dielectric layer or of a thin layer of nitride followed by its oxidation to an oxide layer, to realize what is referred to as an ONO (Oxide-Nitride-Oxide) multi-layer or stack, which may have an oxide equivalent thickness usually between 15 and 25 nm. Following this, the interpoly dielectric layer (ONO) and the layer beneath of doped polysilicon of first level (poly 1) are removed in the peripheral zones, that is, from areas outside the perimeters of the areas occupied by the memory arrays (FLASH-EPROM and EEPROM).

According to a preferred embodiment of the invention, a second layer or in practice a "pre-layer" of gate oxide may then be grown in the active areas of the EEPROM cells, and of the transistors of the external circuit destined to function at the high voltages that are needed in the different functioning phases of the memory, with a calibrated thickness that may be between 10 and 20 nm. Next, the tunnelling window in the active areas of the EEPROM cells is defined and, after removal of the gate oxide pre-layer in this windows, a thin layer of tunnelling oxide is grown with a thickness of about 7 to 9 nm. Simultaneously a gate oxide layer of correlated thickness is also grown in the active areas of the low voltage transistors of the external circuitry, wherein, in absence of a relatively high concentration of n-type dopant in the semiconductor like in tile preventively implanted tunnelling area, the thickness that is simultaneously grown is remarkably lower and ranges within an optimal interval of between 5 to 7 nm, in relation to the functioning requirements of the low voltage transistors.

During this growing phase of the tunnel oxide layer in the EEPROM cells and of the gate oxide in the low voltage transistors, a corresponding increment of the thickness of gate oxide pre-layer previously formed onto the active areas of the same EEPROM cells and of the high voltage transistors also takes whose thickness reaches a desired value of about 15 to 25 nm. The thickness of the pre-layer of gate oxide may therefore be calibrated so as to obtain the desired definitive thickness during the tunnel oxidation, that is through an increment of about 5 to 7 nm.

It has been found that such a pre-layer of gate oxide may satisfactorily endure the masking step for the definition of the tunnelling area and the subsequent removal of the resist mask without appreciably affecting reliability primarily because of the subsequent thickness incrementing oxidation step. Following these very same observations it is also possible to perform the additional masking step and implantation of the tunnelling area of the EEPROM cells over this pre-layer of gate oxide, according to an alternative embodiment.

Following the growth of this tunnel oxide in the homonymous windows defined in the active areas of the EEPROM cells and simultaneously of the gate oxide of the low voltage transistors of the external circuitry, a doped polysilicon layer of second level and optionally also a layer of tungsten silicide may be deposited.

The masking and etching of this second layer of doped polysilicon (POLY 2) complete the definition of the floating gate structures of the EEPROM cells, which overlap the control gate structures of predefined polysilicon of first level (POLY 1) that were realized over the adjacent field oxide according to the particular architecture of the EEPROM cell of the invention. Therefore, it is possible to define the floating gates of the EEPROM cells in such a way that they span over the tunnelling area, thus establishing the capacitive coupling between the floating gate and the drain region of each cell, while another portion of the floating gate is defined in a way of spanning over the thickness incremented layer of gate oxide that covers the active area of the cell with the exception of the tunnelling window.

Together with the definition of the polysilicon layer of second level (POLY 2) are also defined the gate structures (wordline) of the select transistors associated to the EEPROM cells, the gate of the transistors of the external circuit including those destined to operate at high voltage and those destined to operate at low voltage, as well as the control gate structures of the FLASH-EPROM memory cells. At this point, a further masking step and the self-aligned etching of the polysilicon of first level (previously defined along one direction) is usually carried out. This defines the channel length or, in other words, completes the definition of the floating gate of the FLASH-EPROM cells. The floating gate of the EEPROM cells is thus obtained from the polysilicon of the second level. This is made possible by realizing the coupling capacitance between the floating gate and the relative control gate onto the thick layer of field oxide adjacent to the active area of the EEPROM cells.

The structural peculiarities of the EEPROM cells and particularly the way the tunnelling coupling of the floating gate with the drain region of the cell is realized in a compatible manner, implies the renunciation to implement a gate structure of the so-called "stacked" type. The coupling capacitor between the floating gate and the control gate is realized onto the thick layer of field oxide. The single EEPROM cell thus occupies a slightly longer area when compared to a standard "stacked" structure.

Practically, in a 0.4 $\mu$m technology, the area of the single EEPROM cell may be approximately 20 to 30 $\mu m^2$. For the same fabrication technology, this dimension is from two to three times greater than that of a "normal" EEPROM cell of the "stacked" type. However, this drawback is in many applications more than compensated for by the advantages of realizing a fully featured EEPROM memory in relatively inexpensive and compatible manner in a FLASH-EPROM device. This is so considering also that in the majority of situations, a relatively low capacity of this EEPROM memory block is demanded if compared to the capacity of the FLASH-EPROM memory block, which in turn can be fabricated without compromises and with an architecture such as to maximize its compactness.

According to a feature of the invention, not essential but highly preferred, an existing "module" of a standard CMOS fabrication process for high density FLASH memory devices may be conveniently used. In other words, the process module that realizes the so-called "triple well" structure can be used. This technique makes available a p-well region, isolated from the substrate, commonly of a p-type and the EEPROM cells can be advantageously formed in a properly isolated p-well region of the p– substrate. This permits use of negative voltages for the programming of the EEPROM cells, so that the absolute maximum voltage needed for the programming or the cells will be significantly reduced if compared to that required for a standard EEPROM cell, and becomes practically similar to the voltage that is needed for programming the FLASH-EPROM cells.

This also permits the EEPROM cells to use the same gate oxide, typically on the order of 15 to 25 nm, that is employed as the gate dielectric of high voltage transistors of the access circuitry peripheral to the FLASH-EPROM cells during their programming. Isolating the EEPROM cells from the substrate, and thus because of the capability of using negative voltages during their programming in order to reduce absolute maximum voltage levels, remarkably eases the problem of the site generation, within the chip, of the required boosted voltage even when starting from a particularly low battery voltage.

BRIEF DESCRIPTION OF THE DRAWINGS

The different aspects and advantages of the invention will be even more evident through the following description of important embodiments and by referring to the attached drawings, wherein:

FIGS. 4, 5 and 6 are, respectively, a layout, and sectional views on the orthogonal planes indicated in FIG. 4, of an EEPROM cell of the FLASH-EPROM device of the invention.

DETAILED DESCRIPTION OF PREFERRED EMBODIMENTS

Figure 1:
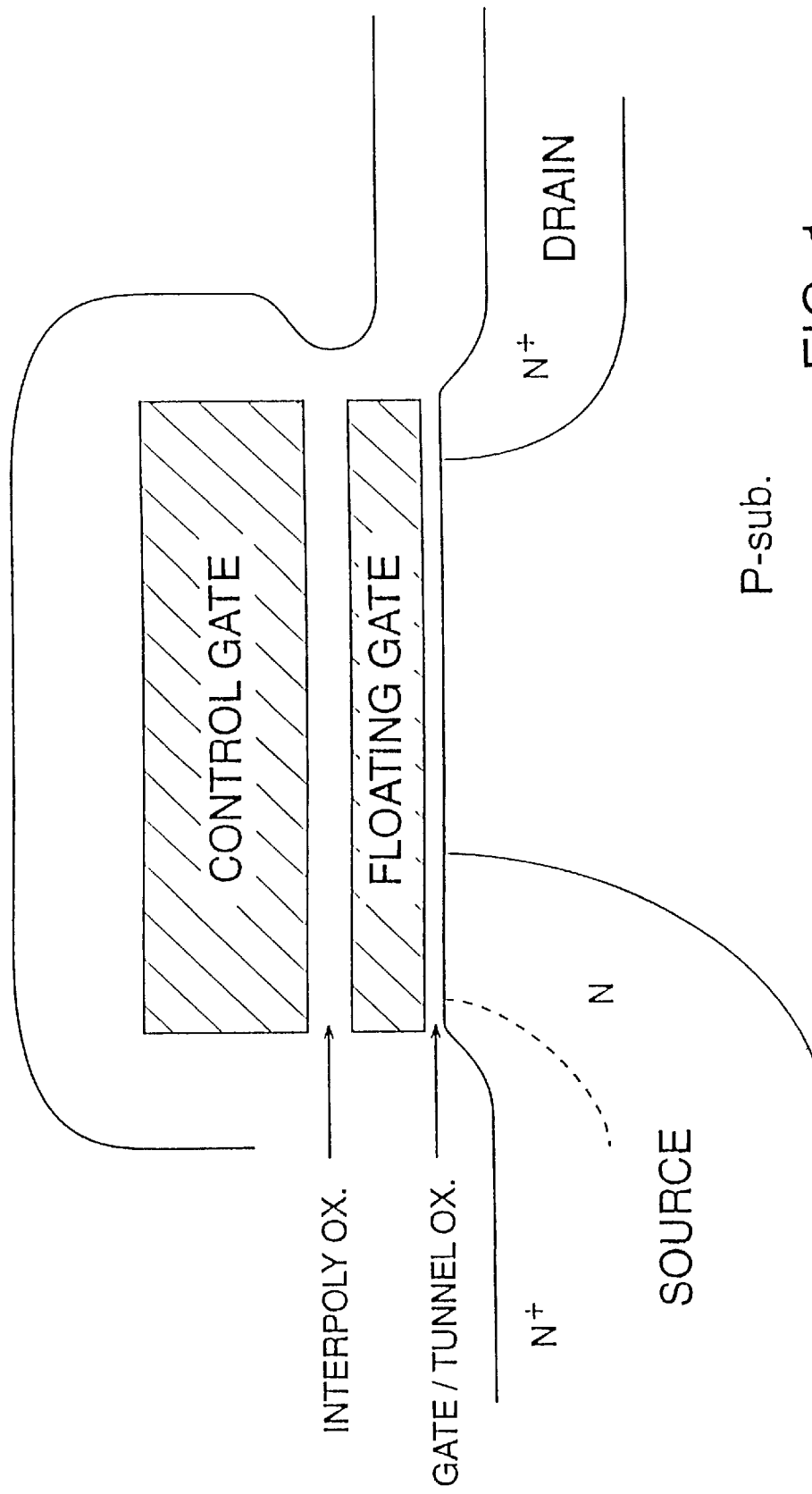
FIG. 1 shows the structure and the relative electric scheme of a prior art FLASH-EPROM for high density CMOS devices.
Figure 2:
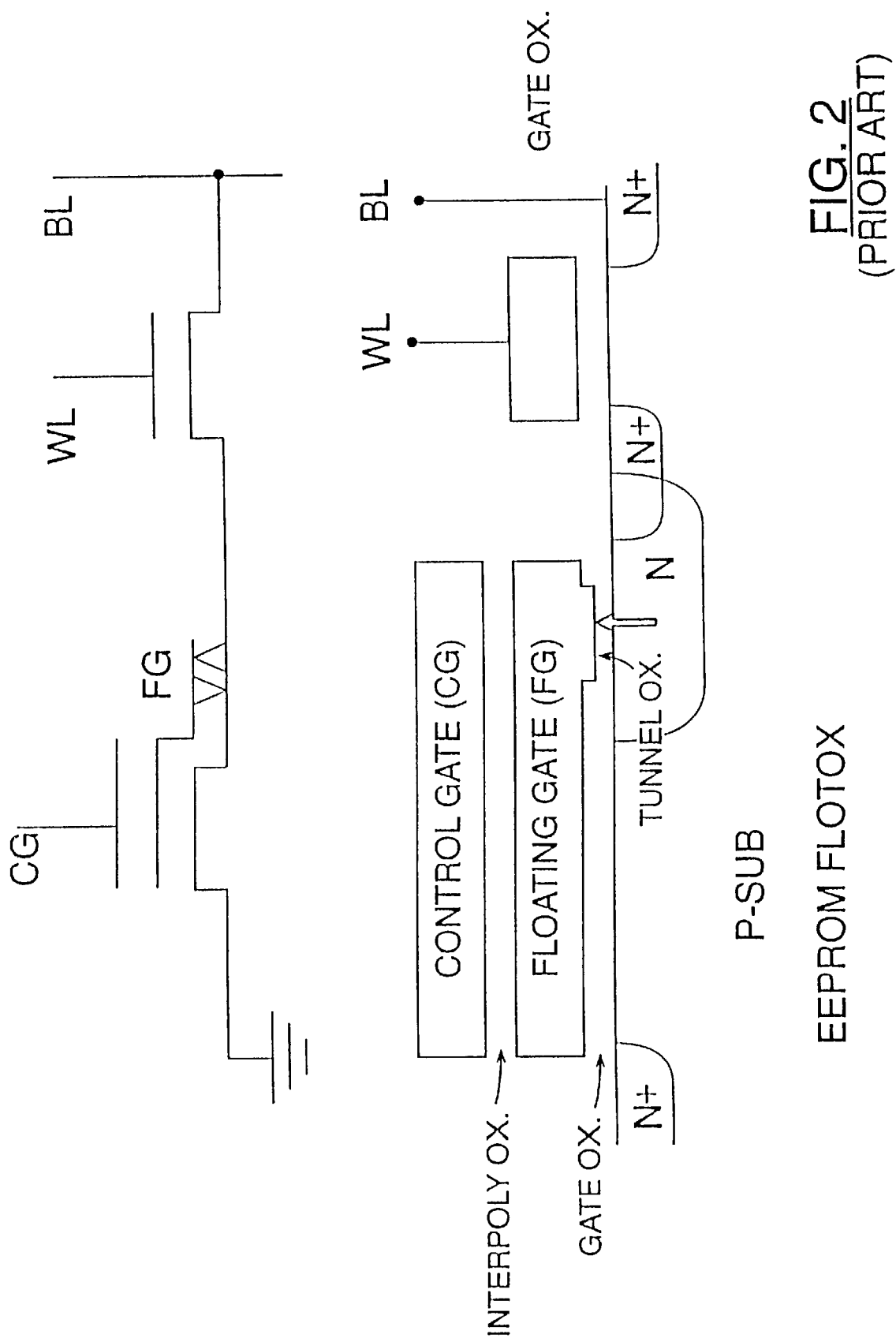
FIG. 2 shows the structure and the relative electric scheme of a prior art EEPROM cell of the "stacked" type.
Figure 3:
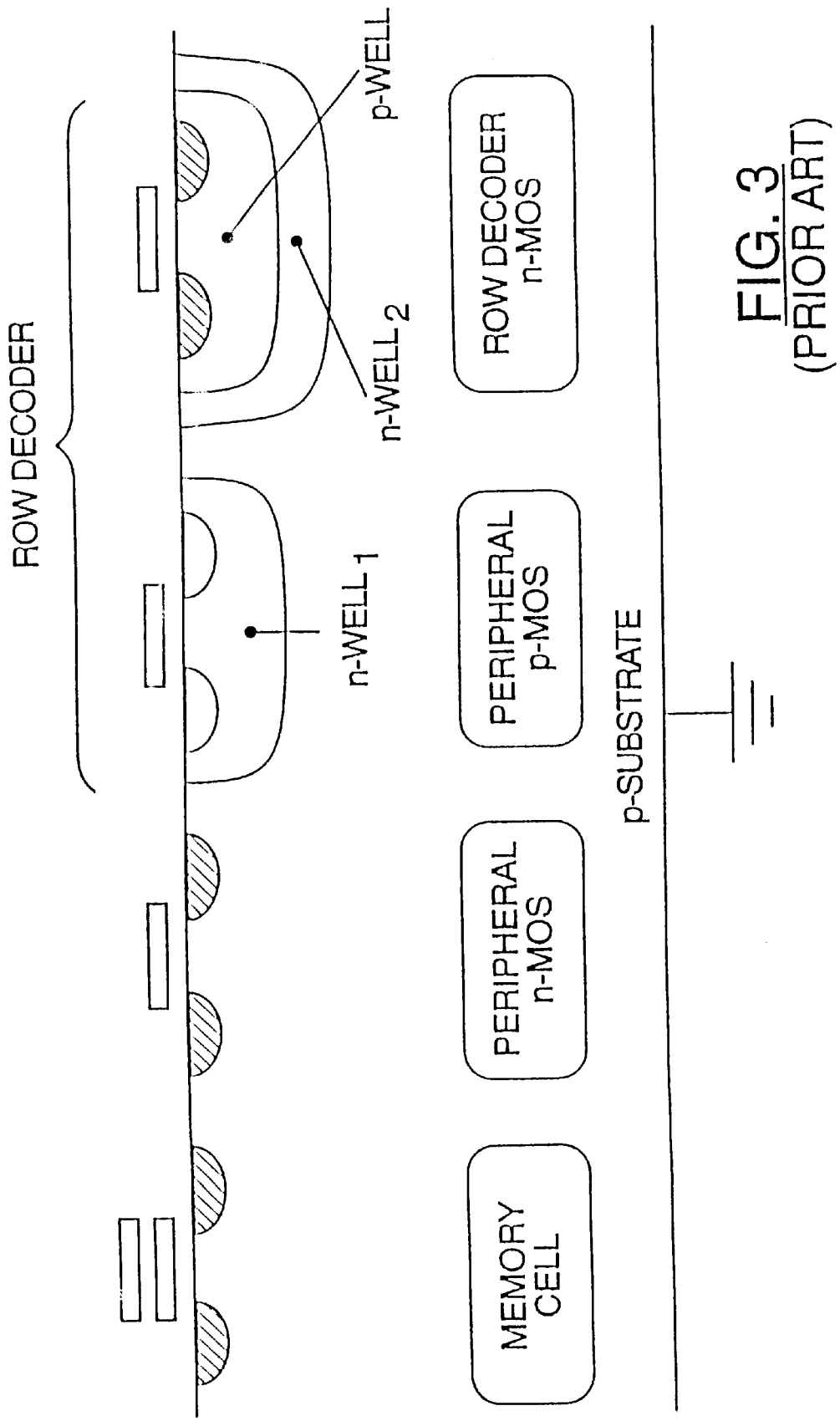
FIG. 3 is a scheme showing the most important aspects of a modern "triple well" CMOS process of the prior art.

The peculiar structure of the EEPROM cell that is compatibly integrated in a CMOS process for high density FLASH-EPROM devices, optimized for low voltage and low consumption applications according to the present invention, is illustrated in FIGS. 4,5 and 6. According to the invention, after completing the definition of the active areas with the growing of their field oxide layer FO, and after formation of the well diffusions, preferably of a first relatively deep n-well 2, and subsequently of an n-well 1 and of a p-well formed internally to the deeper n-well 2, eventual corrective implants of the relative thresholds and other eventual steps of the basic CMOS process, as described in more detail below, is carried out an additional masking step performed for defining a coupling diffusion in the tunnelling zones of the EEPROM cells.

The profile of this additional mask is traced in FIG. 4 with a dotted line. Through this mask an n-type dopant, for example arsenic and/or phosphorus, is implanted in a generally medium dose of approximately 0.5 and $1*10^{15}$ atoms/$cm^2$. This n-diffusion is essential according to the invention to realize the desired capacitive coupling between the floating gate and the drain region of the EEPROM cell.

For purely convenience reasons associated with the choice of a particular layout of the EEPROM array, the same additional mask and the same n-type implantation step, as shown in the example of FIG. 4, may be used to short-circuit the wordline in the zone where a source contact is established (to the ground node GND) in a convenient combined manner for four adjacent cells, according to an array layout of EPROM cells that minimizes the total number of source contacts to be formed and alleviates the criticality of alignment of the relative mask. Alternatively, as will be evident to one skilled in the art, each source contact toward the GND node can be realized for two adjacent cells only, belonging to the same row, according to a different layout of the EEPROM array.

By referring to the plan view of an EEPROM cell shown in FIG. 4, on the active area of the cell, below the definition edge of the thick field oxide layer FO, indicated in the Figure by the dashed line FO, after having grown a dielectric pre-layer of gate oxide of a thickness optimized so as to reach through a successive phase of growth of a tunnel oxide, the desired (design) thickness in the active area of the EEPROM cells and also in the active areas of the peripheral transistors destined to operate at high voltage, a definition mask of the tunnelling window TA is formed. Through this mask the pre-layer of gate oxide is etched and, after the removal of the mask, a new dielectric layer of tunnelling oxide Tox is grown contextually to the growing of gate oxide in the active areas of the low voltage transistors. Within the tunnelling window the layer of the grown oxide may be from 7 to 9 nm thick (because of the previous n-type doping of the semiconductor substrate) whereas in the active areas of the low voltage peripheral transistors the oxide layer will grown to a smaller thickness of about 5 to 7 nm. As already cited above, the masking step and implant of the tunnelling zone may be alternatively performed after having grown the gate oxide pre-layer and immediately before undertaking the masking and etching of the oxide of the tunnelling window.

After this thermal oxidation treatment, a layer of polysilicon of the second level is deposited and suitably doped. The mask POLY 2 is then defined and through this mask are defined the floating gate of the EEPROM cells, the gate of the select transistor and the gate of the transistors of the external circuitry, as well as the control gates (wordline) of the FLASH-EPROM memory (and the channel length of the FLASH-EPROM cells). Following these operations, the fabrication process may continue in a normal manner with the masking and the etching (self-aligned to the defined polysilicon of second level) of the polysilicon of first level, thus completing the definition of the floating gate of the FLASH-EPROM cells, the implantation and diffusion of the source and drain areas, and subsequent deposition of an isolating layer of a dielectric, the steps of contacts formation and to forth.

FIGS. 4, 5 and 6 clearly illustrate the unique structure of the EEPROM cells according to the modified fabrication process of the invention. A reiterated illustration of the process phases for the distinct integrated structures, that is, for peripheral devices and for the FLASH-EPROM cells, is unnecessary for an immediate understanding by those skilled in the art of the modified process of the invention, in view of the general knowledge of a normal FLASH-EPROM process.

According to a preferred embodiment, the process of fabrication, modified according to the present invention, may be articulated in the following sequence of operations:

| PROCESS STEPS | MASKS |
|---|---|
| Formation of the field oxide | (mask of active areas) |
| P-well implantation | (P-well mask) |
| N-well implantation | (N-well mask) |
| Buried N-well implantation | (buried N-well mask) |
| N-channel threshold correction implant | (N-channel LVS mask) |
| P-channel threshold correction implant | (P-channel LVS mask) |
| N diffusion implant for EEPROM tunnel | (N-type diffusion mask) |
| Flash tunnel oxidation | |
| Poly 1 deposition | (poly 1 mask) |
| Formation of ONO interpoly | |
| Removal of ONO and poly 1 from periphery | (matrix mask) |
| Gate pre-oxidation of high voltage transistors | |

-continued

| PROCESS STEPS | MASKS |
|---|---|
| and EEPROM | |
| Definition, etching and tunnel oxidation of EEPROM and gate oxidation of low voltage transistors, and final of growth of gate oxide of high voltage transistors and EEPROM | (EEPROM tunnel mask) |
| Deposition of poly 2 and of silicon carbide | (poly 2 mask) |
| Self-aligned etching of poly 1 in FLASH cells and FLASH implantation | (self-aligned etching mask) |
| SAS etching and source implant of FLASH cells | (SAS mask) |
| LDD implantation of transistors | (LDD mask) |
| Spacers formation | |
| S/D implantation P-channel transistors | (P+ mask) |
| S/D implantation n-channel transistors | (N+ mask) |
| Dielectric deposition | |
| Contacts opening | (contact mask) |
| N+ contact implant | (N+ contact mask) |
| W plug and metal 1 deposition | (metal 1 mask) |
| Dielectric deposition | |
| Vias opening | (vias mask) |
| Metal 2 deposition | (metal 2 mask) |
| Passivation | (pad mask) |

Figure 7:
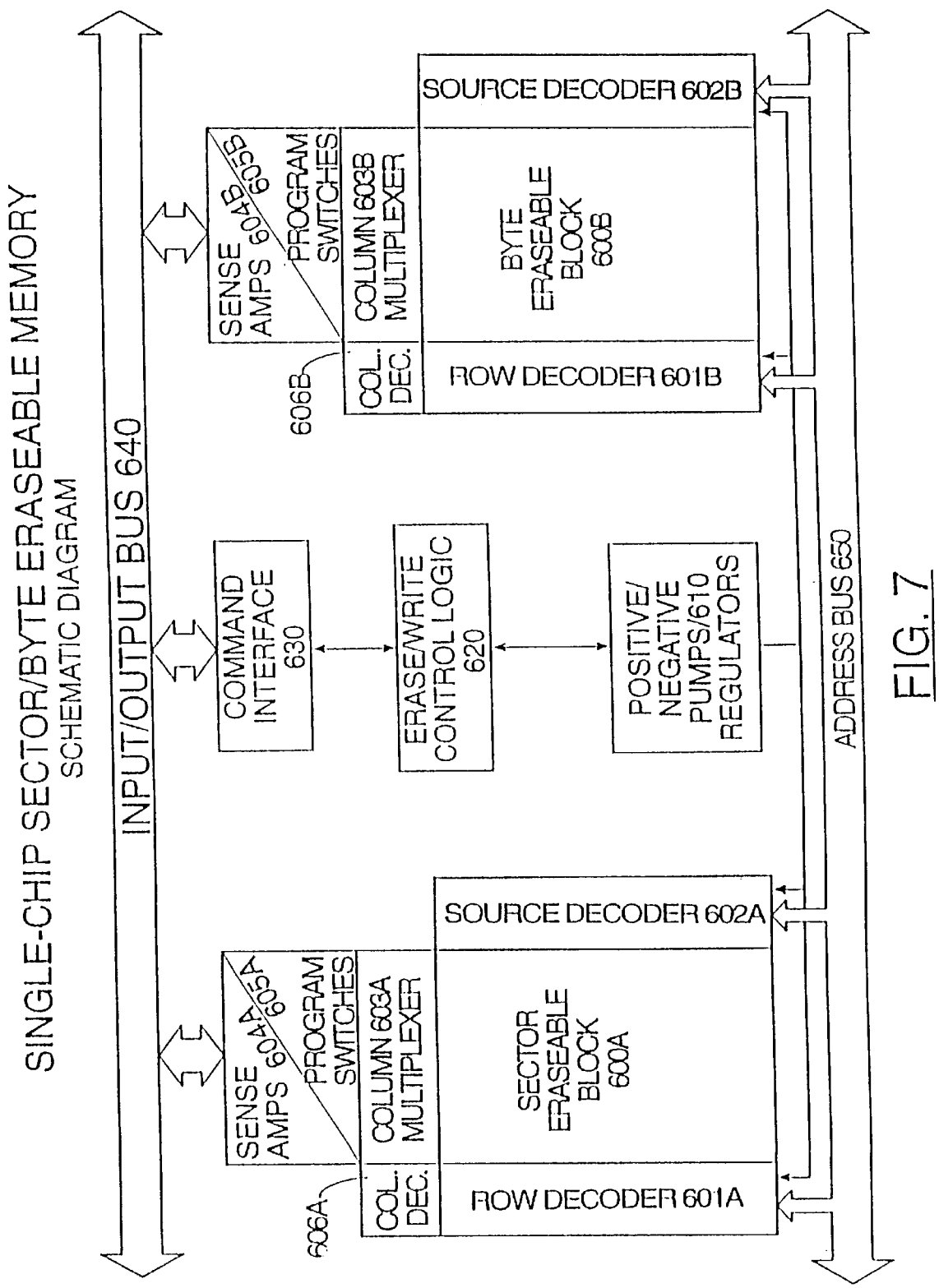
FIG. 7 shows a high level partial block diagram of a FLASH-EPROM memory device comprising also an EEPROM memory block, according to the present invention.

FIG. 7 shows a partial block diagram, exemplary of an integrated circuit whereby there exist both a FLASH-EPROM memory and an EEPROM memory according to the present invention.

The memory array FLASH-EPROM 600A may be a sector-erasable memory, whereas the EEPROM 600B is a byte-erasable memory. Each of these two memories is provided with appropriated row decoders 601A and 601B, with source decoders 602A/602B, with programming switches 605A/605B, and with column decoders 606A/606B. All these components may be of the conventional type. Each memory matrix is interfaced with an address bus 650 and with a data bus 640. The data bus 640 is also interfaced with a control logic 630, which in turn is interfaced with an erase/write control logic 620. This erase/write control logic controls the circuitry that generates the required voltages 610, which may preferably include both negative and positive boosted voltages generated by dedicated charge pump circuits and by associated regulator circuits. The high voltages generated by the circuitry 610 are fed to the programming switches 605A/605B, to the row decoders 601A/601B and to the source decoders 602A/602B.

What is claimed is:

1. A fabrication process for an integrated circuit according to a CMOS technology for low power consumption applications, the integrated circuit comprising a first array of floating gate FLASH-EPROM memory cells and at least a second array of floating gate EEPROM memory cells, the method comprising the steps of:

forming a first dielectric layer of gate oxide of independently optimized thickness onto active areas for the FLASH-EPROM memory cells;

depositing, doping, masking and patterning a polysilicon layer of a first level defining floating gates of said FLASH-EPROM memory cells and control gates of said EEPROM memory cells in a first direction, the control gates of said EEPROM memory cells being above a field oxide adjacent to the active areas thereof;

forming a dielectric layer of interpoly isolation;

removing said dielectric layer of interpoly isolation and polysilicon of the first level in areas external to said first and second arrays;

forming a pre-layer of gate oxide in the active areas of said EEPROM memory cells and of first transistors of a circuit external to said first and second arrays destined to function at a relatively high voltage;

defining a tunneling window in the active area of each EEPROM memory cell and removing said pre-layer of gate oxide therefrom;

growing a tunnel oxide layer in said tunneling window and simultaneously incrementing a thickness of said pre-layer of gate oxide and forming a gate oxide layer in the active areas of second transistors of a circuit external to said first and second arrays destined to function at a relatively low voltage;

depositing, doping, masking and patterning a polysilicon layer of a second level defining floating and select gates of said EEPROM memory cells, the control gates of said FLASH-EPROM memory cells and the gates of said transistors of the external circuit;

masking and etching, in self-alignment to the control gates, said layer of polysilicon of first level for completing definition of the floating gates of said FLASH-EPROM memory cells; and performing an additional masking and implantation step, in a zone of the active area of said EEPROM memory cells including said tunnel window, before forming said first dielectric layer of gate oxide.

2. The process according to claim 1, wherein the implantation step comprises implanting to a dose of about 0.5 to $1 \times 10^{15}$ atoms/cm$^2$ through said tunneling window.

3. The process according to claim 2, wherein the implantation step comprises implanting arsenic or phosphorus.

4. The process according to claim 1, wherein the step of forming the first dielectric layer of gate oxide comprises forming the first dielectric layer of gate oxide to have a thickness in a range of about 9 and 12 nm.

5. The process according to claim 1, wherein the step of forming the pre-layer of gate oxide comprises forming the pre-layer of gate oxide to have a thickness in a range of about 10 and 20 nm.

6. The process according to claim 1, wherein the step of forming the tunnel oxide layer comprises forming an oxide layer to have a thickness in a range of about 7 and 9 nm in said tunneling window and a thickness in a range of about 5 and 7 nm in the active area of said low voltage transistors.

7. The process according to claim 1, further comprising the step of forming a p-well isolated from a p substrate by a deep n-well according to a structure referred to as triple well, and wherein said EEPROM memory cells and high voltages n-channel transistors are realized within the p-well.

8. A fabrication process for an integrated circuit according to a CMOS technology for low power consumption applications, the integrated circuit comprising a first array of floating gate FLASH-EPROM memory cells and at least a second array of floating gate EEPROM memory cells, the method comprising the steps of:

forming a first dielectric layer of gate oxide of independently optimized thickness onto active areas for the FLASH-EPROM memory cells;

depositing, doping, masking and patterning a polysilicon layer of a first level defining floating gates of said FLASH EPROM memory cells and control gates of said EEPROM memory cells in a first direction, the control gates of said EEPROM memory cells being above a field oxide adjacent to the active areas thereof;

forming a dielectric layer of interpoly isolation;

removing said dielectric layer of interpoly isolation and polysilicon of the first level in areas external to said first and second arrays;

forming a pre-layer of gate oxide in the active areas of said EEPROM memory cells and of first transistors of a circuit external to said first and second arrays destined to function at a relatively high voltage;

defining a tunneling window in the active area of each EEPROM memory cell and removing said pre-layer of gate oxide therefrom;

growing a tunnel oxide layer in said tunneling window and simultaneously incrementing a thickness of said pre-layer of gate oxide and forming a gate oxide layer in the active areas of second transistors of a circuit external to said first and second arrays destined to function at a relatively low voltage;

depositing, doping, masking and patterning a polysilicon layer of a second level defining floating and select gates of said EEPROM memory cells, the control gates of said FLASH-EPROM memory cells and the gates of said transistors of the external circuit;

masking and etching, in self-alignment to the control gates, said layer of polysilicon of first level for completing definition of the floating gates of said FLASH-EPROM memory cells;

performing an additional masking and implantation step, in a zone of the active area of said EEPROM memory cells including said tunnel window, after forming said gate oxide pre-layer.

9. The process according to claim 8, wherein the implantation step comprises implanting to a dose of about 0.5 to $1 \times 10^{15}$ atoms/cm$^2$ through said tunneling window.

10. The process according to claim 9, wherein the implantation step comprises implanting arsenic or phosphorus.

11. The process according to claim 8, wherein the step of forming the first dielectric layer of gate oxide comprises forming the first dielectric layer of gate oxide to have a thickness in a range of about 9 and 12 nm.

12. The process according to claim 8, wherein the step of forming the pre-layer of gate oxide comprises forming the pre-layer of gate oxide to have a thickness in a range of about 10 and 20 nm.

13. The process according to claim 8, wherein the step of forming the tunnel oxide layer comprises forming an oxide layer to have a thickness in a range of about 7 and 9 nm in said tunneling window and a thickness in arrange of about 5 and 7 nm in the active area of said low voltage transistors.

14. The process according to claim 8, further comprising the step of forming a p-well isolated from a p substrate by a deep n-well according to a structure referred to as triple well, and wherein said EEPROM memory cells and high voltages n-channel transistors are realized within the p-well.

15. A fabrication process for an integrated circuit according to a CMOS technology for low power consumption applications, the integrated circuit comprising a first array of floating gate FLASH-EPROM memory cells and at least a second array of floating gate EEPROM memory cells, the method comprising the steps of:

forming a first dielectric layer of gate oxide of independently optimized thickness onto active areas for the FLASH-EPROM memory cells;

depositing, doping, masking and patterning a polysilicon layer of a first level defining floating gates of said FLASH-EPROM memory cells and control gates of said EEPROM memory cells in a first direction, the control gates of said EEPROM memory cells being above a field oxide adjacent to the active areas thereof;

forming a dielectric layer of interpoly isolation;

removing said dielectric layer of interpoly isolation and polysilicon of the first level in areas external to said first and second arrays;

forming a pre-layer of gate oxide in the active areas of said EEPROM memory cells and of first transistors of a circuit external to said first and second arrays destined to function at a relatively high voltage;

defining a tunneling window in the active area of each EEPROM memory cell and removing said pre-layer of gate oxide therefrom;

growing a tunnel oxide layer in said tunneling window and simultaneously incrementing a thickness of said pre-layer of gate oxide and forming a gate oxide layer in the active areas of second transistors of a circuit external to said first and second arrays destined to function at a relatively low voltage;

depositing, doping, masking and patterning a polysilicon layer of a second level defining floating and select gates of said EEPROM memory cells, the control gates of said FLASH-EPROM memory cells and the gates of said transistors of the external circuit;

masking and etching, in self-alignment to the control gates, said layer of polysilicon of first level for completing definition of the floating gates of said FLASH-EPROM memory cells; and performing an additional masking and implantation step, in a zone of the active area of said EEPROM memory cells including said tunnel window.

16. The process according to claim 15, wherein the step of performing the additional masking and implantation step is performed before forming the first dielectric layer of gate oxide.

17. The process according to claim 15, wherein the step of performing the additional masking and implantation step is performed after forming said gate oxide pre-layer.

18. The process according to claim 15, wherein the implantation step comprises implanting to a dose of about 0.5 to $1 \times 10^{15}$ atoms/cm$^2$ through said tunneling windows.

19. The process according to claim 15, wherein the implantation step comprises implanting arsenic or phosphorus.

20. The process according to claim 15, wherein the step of forming the first dielectric layer of gate oxide comprises forming the first dielectric layer of gate oxide to have a thickness in a range of about 9 and 12 nm.

21. The process according to claim 15, wherein the step of forming the pre-layer of gate oxide comprises forming the pre-layer of gate oxide to have a thickness in a range of about 10 and 20 nm.

22. The process according to claim 15, wherein the step of forming the tunnel oxide layer comprises forming an oxide layer to have a thickness in a range of about 7 and 9 nm in said tunneling window and a thickness in a range of about 5 and 7 nm in the active area of said low voltage transistors.

23. The process according to claim 15, further comprising the step of forming a p-well isolated from a p substrate by a deep n-well according to a structure referred to as triple well, and wherein said EEPROM memory cells and high voltages n-channel transistors are realized within the p-well.

* * * * *